(12) United States Patent
Kim et al.

(10) Patent No.: US 8,680,652 B2
(45) Date of Patent: Mar. 25, 2014

(54) STACK PACKAGE

(71) Applicant: SK Hynix Inc., Gyeonggi-do (KR)

(72) Inventors: Si Han Kim, Gyeonggi-do (KR); Myung Geun Park, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/687,056

(22) Filed: Nov. 28, 2012

(65) Prior Publication Data

US 2013/0082352 A1    Apr. 4, 2013

Related U.S. Application Data

(62) Division of application No. 12/794,324, filed on Jun. 4, 2010, now abandoned.

(30) Foreign Application Priority Data

Feb. 3, 2010   (KR) .................. 10-2010-0010105

(51) Int. Cl.
*H01L 21/02*     (2006.01)
*H01L 23/48*     (2006.01)

(52) U.S. Cl.
USPC ........... 257/532; 257/777; 257/778; 257/686; 257/724; 257/698

(58) Field of Classification Search
USPC .................. 257/532, 778, 686, 724, 698, 777
See application file for complete search history.

(56) References Cited

U.S. PATENT DOCUMENTS

| | | | |
|---|---|---|---|
| 5,185,689 A | 2/1993 | Maniar | |
| 6,407,456 B1 * | 6/2002 | Ball | 257/777 |
| 7,023,085 B2 | 4/2006 | Pu | |
| 7,230,317 B2 * | 6/2007 | Pearson et al. | 257/532 |
| 2002/0074643 A1 * | 6/2002 | Yamazaki et al. | 257/692 |
| 2004/0178508 A1 * | 9/2004 | Nishimura et al. | 257/778 |
| 2004/0251529 A1 | 12/2004 | Lee et al. | |
| 2005/0173796 A1 | 8/2005 | Pflughaupt et al. | |
| 2005/0212134 A1 | 9/2005 | Pu | |
| 2008/0180878 A1 | 7/2008 | Wang et al. | |
| 2011/0031598 A1 * | 2/2011 | Lee et al. | 257/686 |

FOREIGN PATENT DOCUMENTS

KR     20080046020 A     5/2008

OTHER PUBLICATIONS

USPTO RR dated Jun. 8, 2012 in connection with U.S. Appl. No. 12/794,324.
USPTO NFOA dated Aug. 2, 2012 in connection with U.S. Appl. No. 12/794,324.

\* cited by examiner

*Primary Examiner* — Asok K Sarkar
*Assistant Examiner* — Dmitriy Yemelyanov
(74) *Attorney, Agent, or Firm* — Ladas & Parry LLP

(57) ABSTRACT

A stack package includes a first semiconductor chip first pads and second pads disposed thereon and a second semiconductor chip having third pads and fourth pads electrically connected with the second pads disposed thereon. Capacitors are interposed between the first semiconductor chip and the second semiconductor chip, and include first electrodes electrically connected with the first pads of the first semiconductor chip, second electrodes electrically connected with the third pads of the second semiconductor chip, and dielectrics interposed between the first electrodes and the second electrodes.

2 Claims, 5 Drawing Sheets

STACK PACKAGE

CROSS-REFERENCE TO RELATED APPLICATIONS

The present application claims priority to Korean patent application number 10-2010-0010105 filed on Feb. 3, 2010, which is incorporated herein by reference in its entirety.

BACKGROUND OF THE INVENTION

The present invention relates generally to a stack package, and more particularly, to a stack package in which a capacitor is embedded to reduce power noise.

A semiconductor package having a semiconductor chip capable of storing and/or processing a huge amount of data within a short period has been developed.

It is known that stack a package, in which a plurality of semiconductor chips are stacked, increases data storage capacity. Further, a stack package is known, in which a memory semiconductor chip and a system semiconductor chip are stacked to increase a data storage capacity and also to improve a data processing speed.

In order to maintain a data processing speed at a high level, it is necessary to minimize power noise that is generated at an operating frequency of a semiconductor chip.

In general, reduction of power noise at a package level is effectively accomplished by decreasing an inductance component. One exemplary method of decreasing the inductance component at the package level, includes a decoupling capacitor disposed between a power pad and a ground pad.

Such a capacitor is often formed on the surface of a semiconductor chip, or formed as an embedded capacitor, which is embedded in a substrate.

Known methods of forming such a capacitor are costly and are unreliable.

Further, according to the known methods, it is difficult to realize a capacitor having a large capacity, and therefore such capacitors have limitations in reducing power noise.

In addition, in the case of mounting the capacitor on the substrate, a problem is caused in that the volume of a package increases and a separate mounting process is needed.

BRIEF SUMMARY OF THE INVENTION

Embodiments of the present invention include a stack package in which a capacitor for reducing power noise is reliably embedded at a reduced cost.

Also, embodiments of the present invention include a stack package which can realize a capacitor of a large capacity.

Further, embodiments of the present invention include a stack package which can prevent the volume of the package from increasing and accomplish the simplification of manufacturing processes.

In one embodiment of the present invention, a stack package comprises a first semiconductor chip having a first surface on which first pads and second pads are disposed and a second surface which faces away from the first surface; a second semiconductor chip having a third surface which faces the first surface of the first semiconductor chip and on which third pads and fourth pads electrically connected with the second pads are disposed, and a fourth surface which faces away from the third surface; and capacitors interposed between the first semiconductor chip and the second semiconductor chip, and having first electrodes which are electrically connected with the first pads of the first semiconductor chip, second electrodes which are electrically connected with the third pads of the second semiconductor chip, and dielectrics which are interposed between the first electrodes and the second electrodes.

The stack package may further comprise first connection members electrically connecting the second pads of the first semiconductor chip and the fourth pads of the second semiconductor chip.

The first pads may comprise power pads and the third pads may comprise ground pads, or the first pads may comprise ground pads and the third pads may comprise power pads.

The first electrodes of the capacitors may be electrically connected with the first pads of the first semiconductor chip by the medium of second connection members, and the second electrodes of the capacitors may be electrically connected with the third pads of the second semiconductor chip by the medium of third connection members.

The first electrodes and the second electrodes of the capacitors may be disposed to directly contact the first surface of the first semiconductor chip including the first pads and the third surface of the second semiconductor chip including the third pads, respectively.

The first electrodes and the second electrodes of the capacitors may have a plate-like shape.

The first electrode of each capacitor may include a first plate part and a plurality of first projecting parts which are formed on the first plate part to extend toward the second electrode, and the second electrode of each capacitor may include a second plate part and a plurality of second projecting parts which are formed on the second plate part to be placed between the first projecting parts.

Each capacitor including the first electrode, the second electrode and the dielectric may have an area that is less than that of each of the first and second semiconductor chips.

The dielectrics of the capacitors may be disposed only between the first electrodes and the second electrodes.

The dielectrics of the capacitors may be disposed in a space between the first semiconductor chip and the second semiconductor chip, including spaces between the first electrodes and the second electrodes.

Each of the capacitors may have an area that is the same as that of each of the first and second semiconductor chips and may be defined with an opening through which a connection part between the second pad of the first semiconductor chip and the fourth pad of the second semiconductor chip passes.

The stack package may further comprise first redistribution lines disposed on the third surface of the second semiconductor chip such that one ends thereof are electrically connected with the third pads and the other ends thereof extend to a first edge of the third surface; and second redistribution lines disposed on the third surface of the second semiconductor chip such that one ends thereof are electrically connected with the fourth pads and the other ends thereof extend to a second edge of the third surface which is opposite the first edge.

The stack package may further comprise a substrate having a fifth surface to which the fourth surface of the second semiconductor chip is attached and on which first connection pads connected with the first redistribution lines and second connection pads connected with the second redistribution lines are disposed, and a sixth surface which faces away from the fifth surface and on which third connection pads are disposed; connection members connecting the other ends of the first redistribution lines with the first connection pads and the other ends of the second redistribution lines with the second connection pads; an encapsulant sealing the fifth surface of the substrate including the first and second semiconductor chips and the connection members; and external mounting members attached to the third connection members of the substrate.

The stack package may further comprise through-electrodes formed in the second semiconductor chip to pass through the third and fourth surfaces of the second semiconductor chip, and connected with the third pads and the fourth pads.

The stack package may further comprise a substrate having a fifth surface to which the fourth surface of the second semiconductor chip is attached and on which first connection pads and second connection pads connected with the through-electrodes are disposed, and a sixth surface which faces away from the fifth surface and on which third connection pads are disposed; an encapsulant sealing the fifth surface of the substrate including the first and second semiconductor chips; and external mounting members attached to the third connection pads of the substrate.

According to another embodiment of the present invention, a stack package comprises a first semiconductor chip having a first surface on which first pads and second pads are disposed and a second surface which faces away from the first surface; a second semiconductor chip having a third surface which faces the first surface of the first semiconductor chip and on which third pads and fourth pads electrically connected with the second pads are disposed, and a fourth surface which faces away from the third surface; connection members electrically connecting the first pads with the third pads and the second pads with the fourth pads; a substrate having a fifth surface to which the fourth surface of the second semiconductor chip is attached and on which first connection pads and second connection pads are disposed, and a sixth surface which faces away from the fifth surface and on which third connection pads are disposed; capacitors having first electrodes which are electrically connected with the third pads, second electrodes which are connected with the first connection pads, and dielectrics interposed between the first electrodes and second electrodes; and connection members connecting the fourth pads of the second semiconductor chip with the second connection pads of the substrate.

The stack package may further comprise first redistribution lines disposed on the third surface of the second semiconductor chip such that one ends thereof are electrically connected with the third pads and the other ends thereof extend to a first edge of the third surface, to be connected with the first electrodes of the capacitors; and second redistribution lines disposed on the third surface of the second semiconductor chip such that one ends thereof are electrically connected with the fourth pads and the other ends thereof extend to a second edge of the third surface which is opposite the first edge, to be connected with the second connection pads of the substrate.

The stack package may further comprise an encapsulant sealing the fifth surface of the substrate including the first and second semiconductor chips and the capacitors; and external mounting members attached to the third connection members of the substrate.

According to another embodiment of the present invention, a stack package comprises a first semiconductor chip having a first surface on which first pads and second pads are disposed and a second surface which faces away from the first surface; a second semiconductor chip having a third surface which faces the first surface of the first semiconductor chip and on which third pads and fourth pads electrically connected with the second pads are disposed, and a fourth surface which faces away from the third surface; first redistribution lines disposed on the third surface of the second semiconductor chip, and having one ends which are connected with the first pads and the third pads and the other ends which extend to a first side surface meeting the third surface; second redistribution lines disposed on the third surface of the second semiconductor chip, and having one ends which are connected with the second pads and the fourth pads and the other ends which extend to a second side surface facing away from the first side surface; a substrate having a fifth surface to which the fourth surface of the second semiconductor chip is attached and on which first connection pads and second connection pads are disposed, and a sixth surface which faces away from the fifth surface and on which third connection pads are disposed; capacitors having first electrodes which are connected with the other ends of the first redistribution lines extending to the first side surface of the second semiconductor chip, second electrodes which are connected with the first connection pads, and dielectrics which are interposed between the first electrodes and the second electrodes; and connection members connecting the other ends of the second redistribution lines and the second connection pads of the substrate.

The first and second redistribution lines may directly contact the first and third pads and the second and fourth pads, and may be electrically insulated from the first and second semiconductor chips.

DESCRIPTION OF SPECIFIC EMBODIMENTS

In the present invention, when realizing a stack package of a chip-on-chip structure, power pads and ground pads of an upper semiconductor chip and a lower semiconductor chip are connected by capacitors.

Therefore, according to embodiments of the present invention, even though the capacitors are embedded, the capacitors can be relatively simply formed, costs can be saved, and reliability can be secured.

Also, in the present invention, by freely adjusting the area of the electrodes of the capacitors, capacitors of a large capacity advantageous to the reduction of power noise can be easily realized.

Further, in the present invention, because the capacitors are disposed between the upper semiconductor chip and the lower semiconductor chip, the volume of the entire stack package is not unnecessarily increased.

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
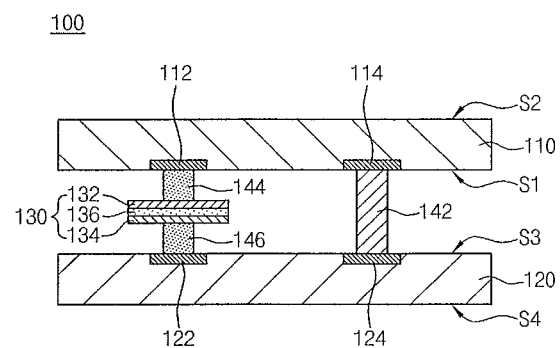
FIGS. 1 and 2 are cross-sectional views showing a stack package in accordance with an embodiment of the present invention.
Figure 2:
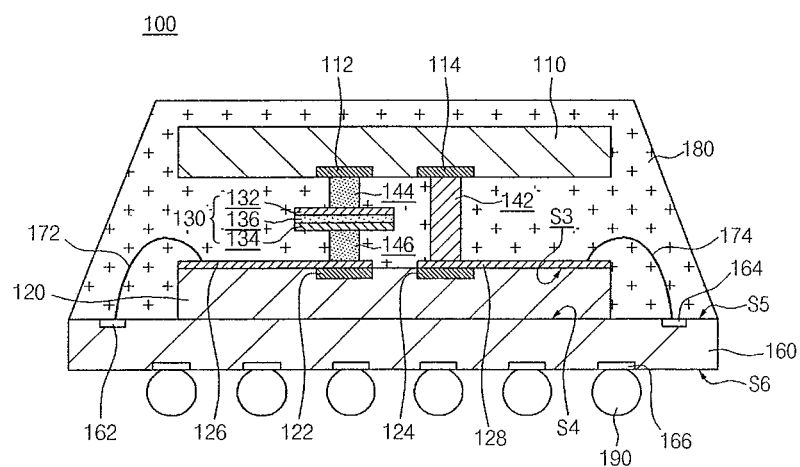

FIGS. 1 and 2 are cross-sectional views showing a stack package in accordance with an embodiment of the present invention.

Referring to FIG. 1, a stack package 100 in accordance with an embodiment of the present invention includes a first semiconductor chip 110, a second semiconductor chip 120, and capacitors 130 connected to the first semiconductor chip 110 and the second semiconductor chip 120.

The first semiconductor chip 110 has a first surface S1 on which first pads 112 and second pads 114 are disposed and a second surface S2 which faces away from the first surface S1. The second semiconductor chip 120 has a third surface S3 on which third pads 122 and fourth pads 124 are disposed and a fourth surface S4 which faces away from the third surface S3. As shown in FIG. 1, the first semiconductor chip 110 and the second semiconductor chip 120 are oppositely positioned. That is, for example, the first semiconductor chip 110 is positioned above the second semiconductor chip 120, and the first surface S1 of the first semiconductor 110 faces the third surface S3 of the second semiconductor chip 120.

For example, the first pads 112 of the first semiconductor chip 110 are power pads, and the third pads 122 of the second semiconductor chip 120, which correspond to the first pads 112 of the first semiconductor chip 110, are ground pads. Alternatively, the first pads 112 of the first semiconductor chip 110 may be ground pads, and the third pads 122 of the second semiconductor chip 120, which correspond to the first pads 112 of the first semiconductor chip 110, may be power pads. Both the second pads 114 of the first semiconductor chip 110 and the fourth pads 124 of the second semiconductor chip 120 are signal pads.

It should be understood, that while not shown in a drawing, each of the first semiconductor chip 110 and the second semiconductor chip 120 has therein a circuit unit, which includes a data storage section for storing data and a data processing section for processing data.

The third pads 122 of the second semiconductor chip 120 can be disposed at positions which face the first pads 112 of the first semiconductor chip 110 as shown in FIG. 1. Of course, while not shown in a drawing, it is conceivable that the third pads 122 of the second semiconductor chip 120 can be disposed at positions which do not face the first pads 112 of the first semiconductor chip 110.

The second pads 114 of the first semiconductor chip 110 and the corresponding fourth pads 124 of the second semiconductor chip 120 are electrically connected with each other through first connection members 142. The first connection members 142 may comprise an electrically conductive material, for example, solders or bumps.

Each capacitor 130 includes a first electrode 132 electrically connected with the first pad 112 of the first semiconductor chip 110, a second electrode 134 electrically connected with the third pad 122 of the second semiconductor chip 120, and a dielectric 136 interposed between the first electrode 132 and the second electrode 134.

The first electrode 132 is electrically connected with the first pad 112 of the first semiconductor chip 110 through a second connection member 144, and the second electrode 134 is electrically connected with the third pad 122 of the second semiconductor chip 120 through a third connection member 146. The second and third connection members 144 and 146 may comprise an electrically conductive material, for example solders or bumps.

In the embodiment, a surface of the capacitor 130 has an area that is less than an area of the surfaces S1, S3 of the first and second semiconductor chips 110 and 120, respectively.

Figure 3:
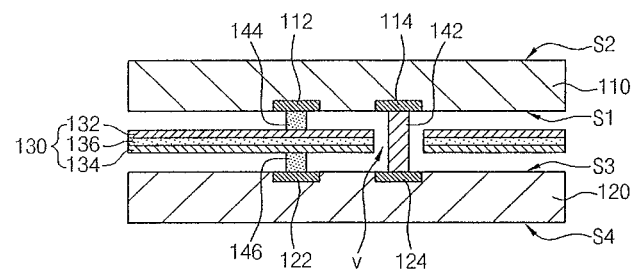
FIGS. 3 through 7 are cross-sectional views showing a capacitor of the stack package in accordance with an embodiment of the present invention.

However, as shown in FIG. 3, a surface of the capacitor 130 can have an area as great as the area of each of the surfaces S1, S3 first and second semiconductor chips 110 and 120, respectively, in order to secure an increased capacity. In this case as shown in FIG. 3, the capacitor 130 has an opening v through which a connection part between the second pad 114 of the first semiconductor chip 110 and the fourth pad 124 of the second semiconductor chip 120 passes. In detail, the first electrode 132, the second electrode 134 and the dielectric 136 of the capacitor 130 are formed so as to have defined therein the opening v through which the first connection member 142 connecting the second pad 114 of the first semiconductor chip 110 and the fourth pad 124 of the second semiconductor chip 120 passes.

In the embodiment shown in FIG. 3, the first electrode 132 and the second electrode 134 of the capacitor 130 are connected with the first pad 112 of the first semiconductor chip 110 and the third pad 122 of the second semiconductor chip 120 through the second connection member 144 and the third connection member 146, respectively.

Figure 4:
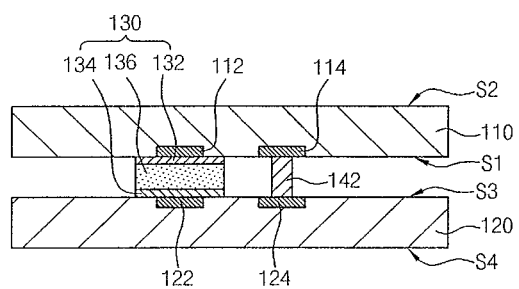

As shown in FIG. 4, the first electrode 132 and the second electrode 134 of the capacitor 130 can be formed so as to directly contact the first surface S1 of the first semiconductor chip 110 including the first pad 112 and the third surface S3 of the second semiconductor chip 120 including the third pad 122, respectively.

Figure 5:
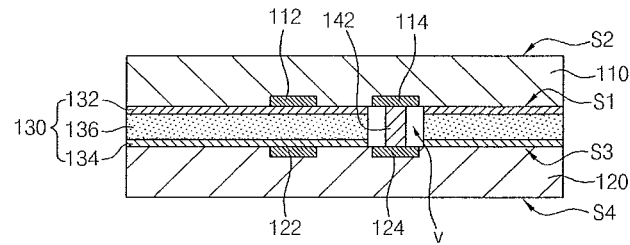

As shown in FIG. 4, a surface of the capacitor 130, which includes the first electrode 132 and the second electrode 134 formed to directly contact the first surface S1 of the first semiconductor chip 110 and the third surface S3 of the second semiconductor chip 120, can have an area that is less than the area of surfaces S1 and S3 of the first and second semiconductor chips 110 and 120, respectively, as shown in FIG. 4, or can have an area that is the same as the area of the surfaces S1 and S3 of the first and second semiconductor chips 110 and 120, respectively, as shown in FIG. 5, in order to secure an increased capacity. In the latter case as shown in FIG. 5, the capacitor 130 has an opening v through which the first connection member 142 connecting the second pad 114 of the first semiconductor chip 110 and the fourth pad 124 of the second semiconductor chip 120 passes.

In addition, in the embodiment, each of the first electrode 132 and the second electrode 134 of the capacitor 130 is formed to have a plate-like shape as shown in FIGS. 1 through 5.

Figure 6:
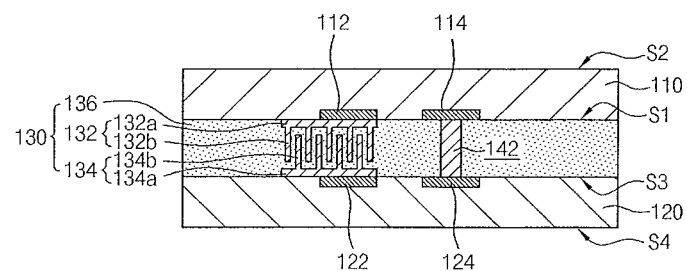

As shown in FIG. 6, in order to secure an increased capacity, the first electrode 132 can be formed to have a first plate part 132a and a plurality of first projecting parts 132b formed on the first plate part 132a so as to project toward the second electrode 134, and the second electrode 134 can be formed to have a second plate part 134a and a plurality of second projecting parts 134b formed on the second plate part 134a so as to be respectively placed between the first projecting parts 132b.

Figure 7:
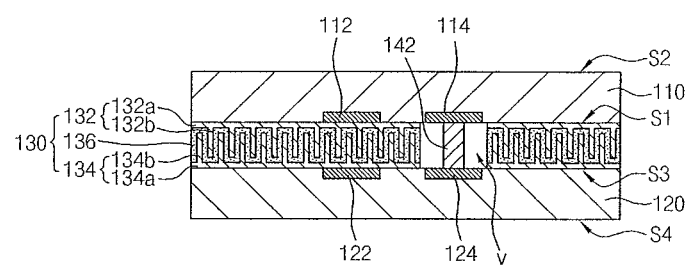

A surface of the capacitor 130, which includes the first electrode 132 having the first plate part 132a and the first projecting parts 132b and the second electrode 134 having the second plate part 134a and the second projecting parts 134b, can be formed to have an area that is less than the area of each of the surfaces S1 and S3 of the first and second semiconductor chips 110 and 120, respectively, as shown in FIG. 6, or can be formed to have an area that is the same as the area of each of the surfaces S1 and S3 of the first and second semiconductor chips 110 and 120, as shown in FIG. 7. In the latter case, the capacitor 130 has an opening v through which the first connection member 142 connecting the second pad 114 of the first semiconductor chip 110 and the fourth pad 124 of the second semiconductor chip 120 passes.

In the case of the stack package structures shown in FIGS. 6 and 7, the space between the first semiconductor chip 110 and the second semiconductor chip 120 is filled with the dielectric 136 of the capacitor 130, therefore it is not necessary to fill a separate underfill in the space between the first semiconductor chip 110 and the second semiconductor chip 120, and an underfill omission effect can be achieved.

In addition, while it is illustrated and described in the embodiment that the third pads 122 of the second semiconductor chip 120 are disposed on the third surface S3 of the second semiconductor chip 120 in such a way as to respectively face the first pads 112 of the first semiconductor chip 110, it is conceivable that the third pads 122 of the second semiconductor chip 120 can be disposed on the third surface S3 of the second semiconductor chip 120 at positions which do not face the first pads 112 of the first semiconductor chip 110. In this case, it can be understood that the shape of the capacitors 130 is changed accordingly.

Referring to FIG. 2, the stack package 100 can include first redistribution lines 126 and second redistribution lines 128 which are formed on the third surface S3 of the second semiconductor chip 120. Each first redistribution line 126 is disposed on the third surface S3 of the second semiconductor chip 120 such that one end thereof is electrically connected with the third pad 122 and the second end thereof extends to an edge of the third surface S3. Each second redistribution line 128 is disposed on the third surface S3 of the second semiconductor chip 120 such that one end thereof is electrically connected with the fourth pad 124 and the second end thereof extends to a second edge of the third surface S3 which is opposite the first edge. The first and second redistribution lines 126 and 128 facilitate easy electrical connection with a substrate, which will be described below.

The stack package 100 as shown in FIG. 2, can further includes a substrate 160 having an upper surface on which the second semiconductor chip 120 is attached, connection members 172 and 174 which connect the redistribution lines 126 and 128 with the substrate 160, and an encapsulant 180 sealing the first and second semiconductor chips 110 and 120 and the connection members 172 and 174, and external mounting members 190 which are attached to the substrate 160.

The substrate 160 has a fifth surface S5 to which the fourth surface S4 of the second semiconductor chip 120 is attached and on which first connection pads 162 and second connection pads 164 are disposed, and a sixth surface S6 which faces away from the fifth surface S5 and on which third connection pads 166 are disposed. For example, the substrate 160 may comprise a printed circuit board.

The first connection pads 162 are disposed on portions of the fifth surface S5 of the substrate 160 which are adjacent to the second of the first redistribution lines 126, and are electrically connected with the first redistribution lines 126 through the first connection members 172. The second connection pads 164 are disposed on portions of the fifth surface S5 of the substrate 160 which at the second ends of the second redistribution lines 128, and are electrically connected with the second redistribution lines 128 through the second connection members 174.

The first connection members 172 and the second connection members 174 preferably comprise conductive wires, or may comprise a conductive ink or a pattern film. The encapsulant 180 preferably comprises an epoxy molding compound (EMC), or may comprise other insulation materials.

The external mounting members 190 preferably comprise solder balls, or may comprise conductive pins or a solder paste.

Since the stack package according to an embodiment has a structure in which the capacitors are connected to the power pads of the first semiconductor chip and the grounds pads of the second semiconductor chip, the capacitors are can be easily formed, and the reliability of the capacitors can be improved.

Also, since the stack package has a structure in which the capacitors are disposed between the first semiconductor chip and the second semiconductor chip, the volume of the package is not unnecessarily increased, and a separate process for mounting capacitors is not needed.

Further, the capacitors can have a large capacity since sectional shape of the capacitor electrodes can be optionally changed as described above, and accordingly, power noise reducing effect can be improved.

Figure 8:
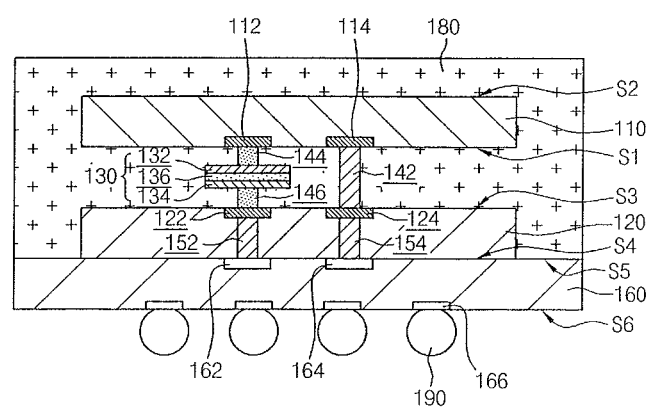
FIG. 8 is a cross-sectional view showing a stack package in accordance with an embodiment of the present invention.

FIG. 8 is a cross-sectional view showing an exemplary stack package. The same reference numerals will be used to refer to the same component elements as those shown in FIG. 2, and the detailed descriptions of the same component elements will be omitted herein.

Referring to FIG. 8, a stack package 200 includes first and second through-electrodes 152 and 154 formed within a second semiconductor chip 120. The first and second through-electrodes 152 and 154 are formed so as to pass through a third surface S3 and a fourth surface S4 of the second semiconductor chip 120 and be connected with third pads 122 and fourth pads 124, respectively. Preferably, the first and second through-electrodes 152 and 154 are electrically insulated from the body of the second semiconductor chip 120.

The stack package 200 as shown in FIG. 8 further includes a substrate 160 and connection members 162 and 164. The positions of the connection members 162 and 164 are changed when compared to those of the first embodiment. The substrate 160 may comprise a printed circuit board. The substrate 160 has a fifth surface S5 to which the fourth surface S4 of the second semiconductor chip 120 is attached and on which first connection pads 162 and second connection pads 164 are disposed, and a sixth surface S6 which faces away from the fifth surface S5 and on which third connection pads 166 are disposed. The first connection pads 162 and the second connection pads 164 are respectively connected with the first through-electrodes 152 and the second through-electrodes 154, as will be described below in detail.

The stack package 200 as shown in FIG. 8 further includes an encapsulant 180 sealing the fifth surface S5 of the substrate 160 and the first and second semiconductor chip 110 and 120, and includes external mounting members 190, which are attached to the third connection pads 166 of the substrate 160. The external mounting members 190 preferably comprise solder balls, or may comprise conductive pins or a solder paste.

The stack package 200 as shown in FIG. 8 further includes capacitors 130 constructed so as to be connected with the first and second semiconductor chips 110 and 120. Each capacitor 130 includes a first electrode 132 electrically connected with each first pad 112 of the first semiconductor chip 110 through a second connection member 144, a second electrode 134 electrically connected with each third pad 122 of the second semiconductor chip 120 through a third connection member 146, and a dielectric 136 interposed between the first electrode 132 and the second electrode 134.

While it is shown FIG. 8 in that a surface of the capacitor 130 has an area that is less than the area of each of the surfaces S1 and S3 of the first and second semiconductor chips 110 and 120, respectively, it can be envisaged that a surface of the capacitor 130 can have an area that is the same as the area of each of the surfaces S1 and S3 of the first and second semiconductor chips 110 and 120, respectively, as shown in FIG. 3, so as to secure a large capacity. In this case, the capacitor 130 has an opening v through which the first connection member 142 connecting the second pad 114 of the first semiconductor chip 110 and the fourth pad 124 of the second semiconductor chip 120 passes.

Also, while it is shown in FIG. 8 that the first and second electrodes 132 and 134 of the capacitor 130 are formed to be respectively connected with the first pad 112 of the first semiconductor chip 110 and the third pad 122 of the second semiconductor chip 120 through the second and third connection members 144 and 146, it can be contemplated that the first electrode 132 and the second electrode 134 of the capacitor 130 can be formed in such a way as to directly contact the first surface S1 of the first semiconductor chip 110 including the first pad 112 and the third surface S3 of the second semiconductor chip 120 including the third pad 122, respectively, as shown in FIGS. 4 and 5.

Moreover, while it is shown in FIG. 8 that each of the first and second electrodes 132 and 134 of the capacitor 130 has a plate-like shape, it is conceivable that the first electrode 132 can be formed to have a first plate part and first projecting parts and the second electrode 134 can be formed to have a second plate part and second projecting parts as shown in FIGS. 6 and 7, in order to secure a large capacity.

Here, the capacitor 130, which includes the first electrode 132 having the first plate part and the first projecting parts, the second electrode 134 having the second plate part and the second projecting parts, and the dielectric 136 interposed between the first electrode 132 and the second electrode 134, can be formed such that an area of a surface of the capacitor 130 is less than that of each of the surfaces S1 and S3 of the first and second semiconductor chips 110 and 120, respectively, as shown in FIG. 6, or can be formed such that an area of a surface of the capacitor 130 is the same as that of each of the first and second semiconductor chips 110 and 120, as shown in FIG. 7.

Figure 9:
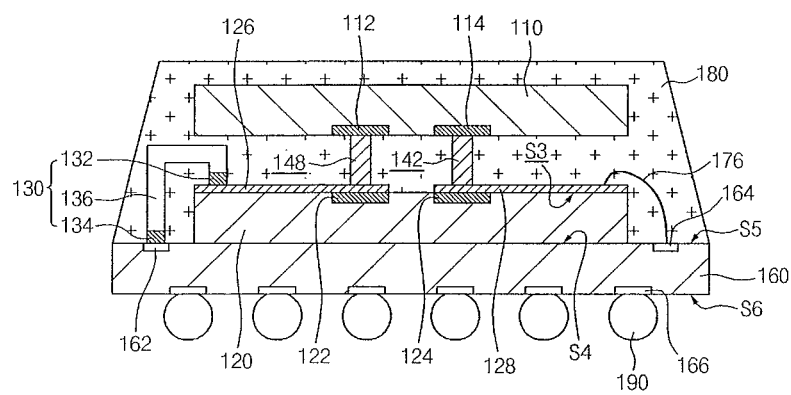
FIG. 9 is a cross-sectional view showing a stack package in accordance with an embodiment of the present invention.

FIG. 9 is a cross-sectional view showing an exemplary stack package. The same reference numerals will be used to refer to the same component elements as those shown in FIG. 2, and the detailed descriptions of the same component elements will be omitted herein.

Referring to FIG. 9, a stack package 300 includes capacitors 130 which are formed between a second semiconductor chip 120 and a substrate 160. In detail, each capacitor 130 includes a first electrode 132 which is connected to a third pad 122 of a second semiconductor chip 120, a second electrode 134 which is connected to a first connection pad 162 of a substrate 160, and a dielectric 136 which is interposed between the first electrode 132 and the second electrode 134.

The first electrode 132 is connected with the second of a first redistribution line 126 formed on a third surface S3 of the second semiconductor chip 120, where one end of the first redistribution line 126 is connected with the third pad 122 and the second end extending to the first edge of the third surface S3. Therefore, it can be understood that the first electrode 132 is electrically connected with the third pad 122 of the second semiconductor chip 120 through the first redistribution line 126.

The dielectric 136 of the capacitor 130 is not limited to the shape as shown in FIG. 8 and can be formed to have various shapes according to different manufacturing processes.

In the stack package 300, a second pad 114 disposed on a first surface S1 of a first semiconductor chip 110 and a fourth pad 124 disposed on the third surface S3 of the second semiconductor chip 120 are electrically connected with each other through a first connection member 142, and a first pad 112 disposed on the first surface S1 of the first semiconductor chip 110 and the third pad 122 disposed on the third surface S3 of the second semiconductor chip 120 are electrically connected with each other through a fourth connection member 148. The first and fourth connection members 142 and 148 may comprise, for example, a conductive material such as solders or bumps.

In the stack package 300, a second redistribution line 128 is formed on the third surface S3 of the second semiconductor chip 120 such that one end thereof is electrically connected with the fourth pad 124 and a second end extends to the second edge of the third surface S3 which is opposite the first edge. The second of the second redistribution line 128 is connected with a second connection pad 164 which is disposed on a fifth surface S5 of the substrate 160, through a connection member 176.

Further, in the stack package 300, the fifth surface S5 of the substrate 160, the first and second semiconductor chips 110 and 120, and the capacitors 130 are sealed by an encapsulant 180 such as an EMC. External mounting members 190 such as solder balls are attached to third connection pads 166 disposed on a sixth surface S6 of the substrate 160 facing away from the fifth surface S5.

Figure 10:
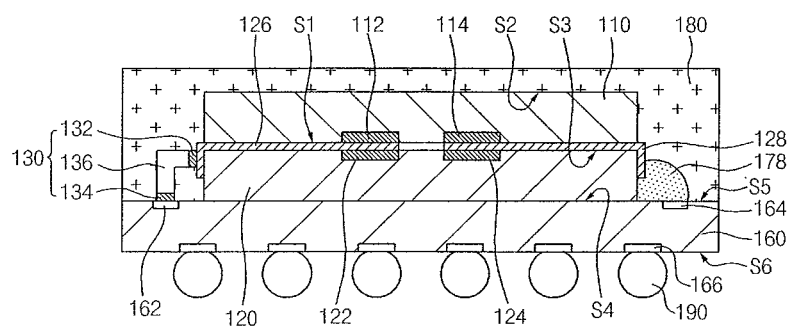
FIG. 10 is a cross-sectional view showing a stack package in accordance with an embodiment of the present invention.

FIG. 10 is a cross-sectional view illustrating an exemplary stack package. The same reference numerals will be used to refer to the same component elements as those shown in FIG. 2, and the detailed descriptions of the same component elements will be omitted herein.

Referring to FIG. 10, a stack package 400 includes first and second semiconductor chips 110 and 120 which are oppositely positioned, a substrate 160 to which a fourth surface S4 of the second semiconductor chip 120 is attached, and capacitors 130 which are formed between the second semiconductor chip 120 and the substrate 160.

The stack package 400 further includes first redistribution lines 126 and second redistribution lines 128 which are interposed between the first semiconductor chip 110 and the second semiconductor chip 120.

Each first redistribution line 126 is formed on a third surface S3 of the second semiconductor chip 120 such that a first end thereof is connected with a first pad 112 of the first semiconductor chip 110 and a third pad 122 of the second semiconductor chip 120 and a second end thereof extends to a first side surface adjoining the third surface S3. Each second redistribution line 128 is formed on the third surface S3 of the second semiconductor chip 120 such that a first end thereof is connected with a second pad 114 of the first semiconductor chip 110 and a fourth pad 124 of the second semiconductor chip 120 and a second end thereof extends to a second side surface adjoining the third surface S3 and facing away from the first side surface. The first and second redistribution lines 126 and 128 are disposed to directly contact both a first surface S1 of the first semiconductor chip 110, including first pads 112, and the third surface S3 of the second semiconductor chip 120, including third pads 122, and the first surface S1 of the first semiconductor chip 110, including second pads 114, and the third surface S3 of the second semiconductor chip 120, including fourth pads 124, respectively. The first and second redistribution lines 126 and 128 are electrically insulated from the bodies of the first and second semiconductor chips 110 and 120.

The substrate 160 has a fifth surface S5 to which the fourth surface S4 of the second semiconductor chip 120 is attached and on which first and second connection pads 162 and 164 are disposed, and a sixth surface S6 facing away from the fifth surface S5 on which third connection pads 166 are disposed. The first connection pads 162 are disposed on portions of the fifth surface S5 of the substrate 160 adjacent to the first side surface of the second semiconductor chip 120, and the second connection pads 164 are disposed on portions of the fifth surface S5 of the substrate 160 adjacent to the second side surface of the second semiconductor chip 120.

Each capacitor 130 includes a first electrode 132 connected with the third pad 122 of the second semiconductor chip 120, a second electrode 134 connected with the first connection pad 162 of the substrate 160, and a dielectric 136 interposed between the first electrode 132 and the second electrode 134. In detail, the first electrode 132 is formed to be connected with the second end of the first redistribution line 126 which has the first end thereof connected with the third pad 122 of the second semiconductor chip 120 and the second end thereof disposed on the first side surface of the second semiconductor chip 120. Therefore, it can be understood that the first electrode 132 is electrically connected with the third pad 122 of the second semiconductor chip 120 through the first redistribution line 126.

The dielectric 136 of the capacitor 130 can be formed to have various shapes in addition to the shape shown in the drawing.

The stack package 400 further includes connection members 178 connecting the second ends of the second redistribution lines 128 disposed on the second side surface with second connection pads 164 of the substrate 160, external mounting members 190 attached to third connection pads 166 disposed on the sixth surface S6 of the substrate 160, and an encapsulant 180 sealing the fifth surface S5 of the substrate 160, the first and second semiconductor chips 110 and 120, and the capacitors 130. The connection members 178 can comprise a conductive material such as solders, and the encapsulant 180 can comprise, for example, an EMC. The external mounting members 190 preferably comprise solder balls, or can comprise conductive pins or a solder paste.

In the stack package 400, in the case where the first connection pads 162 of the substrate 160, to which the second electrodes 134 of the capacitors 130 are connected, comprise power pads, the first and third pads 112 and 122 of the first and second semiconductor chips 110 and 120, which are connected to the first electrodes 132 of the capacitors 130 through the first redistribution lines 126, comprise power pads. Alternatively, in the case where the first connection pads 162 of the substrate 160, to which the second electrodes 134 of the capacitors 130 are connected, comprise ground pads, the first and third pads 112 and 122 of the first and second semiconductor chips 110 and 120, which are connected to the first electrodes 132 of the capacitors 130 through the first redistribution lines 126, comprise ground pads.

As is apparent from the above description, the stack package according to the present invention provides advantages in that, since the stack package has a structure in which decoupling capacitors are disposed between power pads and ground pads at a package level, power noise can be effectively reduced through the reduction of an inductance component, and accordingly, a desired data processing speed can be maintained.

Although specific embodiments of the present invention have been described for illustrative purposes, those skilled in the art will appreciate that various modifications, additions and substitutions are possible, without departing from the scope and the spirit of the invention as disclosed in the accompanying claims.

The invention claimed is:

1. A stack package comprising:
    a first semiconductor chip including a first surface having a first pad and a second pad disposed thereon, and a second surface facing away from the first surface;
    a second semiconductor chip including a third surface having a third pad and a fourth pad disposed thereon, and a fourth surface which facing away from the third surface, wherein the third surface of the second semiconductor chip faces the first surface of the first semiconductor chip and the fourth pad are electrically connected with the second pad;
    connection members electrically connecting the first pad with the third pad and the second pad with the fourth pad;
    a substrate including a fifth surface attached to the fourth surface of the second semiconductor chip and having a first connection pad and a second connection pad disposed thereon, and a sixth surface facing away from the fifth surface and having third connection pads disposed thereon;
    first redistribution line disposed on the third surface of the second semiconductor chip and having first end electrically connected with the third pad and second end extending to a first edge of the third surface;
    second redistribution line disposed on the third surface of the second semiconductor chip and having first end electrically connected with the fourth pad and second end extending to a second edge of the third surface opposite the first edge;
    a capacitor including a first electrodes electrically connected with the second end of the first redistribution line, a second electrode electrically connected with the first connection pad of the substrate, and a dielectric interposed between the first electrode and second electrode; and
    an interconnection member connecting the second end of the second redistribution line with the second connection pad of the substrate.

2. The stack package according to claim 1, further comprising:
    an encapsulant sealing the fifth surface of the substrate, the first and second semiconductor chips, and the capacitor; and
    external mounting members attached to the third connection members of the substrate.

* * * * *